(12) United States Patent
He et al.

(10) Patent No.: US 6,545,627 B1
(45) Date of Patent: Apr. 8, 2003

(54) METHOD AND APPARATUS TO PERFORM AN ANALOG TO DIGITAL CONVERSION

(75) Inventors: Yueming He, Chandler, AZ (US); Bart R. McDaniel, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/033,954

(22) Filed: Dec. 19, 2001

(51) Int. Cl.⁷ ................................................. H03M 1/12
(52) U.S. Cl. ........................ 341/155; 341/120; 341/150; 341/172
(58) Field of Search ................................ 341/155, 156, 341/120, 122, 150, 161, 162, 164, 165, 115, 172, 158, 118

(56) References Cited

U.S. PATENT DOCUMENTS

| 5,027,116 A | * | 6/1991 | Armstrong et al. | .......... 341/120 |
| 5,107,266 A | * | 4/1992 | Kim | ............................. 341/163 |
| 5,644,308 A | * | 7/1997 | Kerth et al. | ................. 341/120 |

OTHER PUBLICATIONS

Onodera et al., "A Cyclic A/D Converter That Does Not Require Ratio–Matched Components", IEEE Journal of Solid State Circuits, vol. 23, No. 1; Feb. 1988.
Li et al., A Ratio–Independent Algorithmic Analog–To–Digital Conversion Technique, IEEE Journal of Solid State Circuits, vol. SC–19, No. 5, Dec. 1984.
Zheng et al.,"Efficient Error–Canceling Algorithmic ADC", IEEE International Symposium on Circuits and Systems, May 28–31, 2000, Geneva, Switzerland, pp. I–451–I–544.
Johns et al., "Analog Integrated Circuit Design", Chapter 13, pp. 504–507, John Wiley & Sons, Canada, 1997.

* cited by examiner

*Primary Examiner*—Brian Young
*Assistant Examiner*—John Nguyen
(74) *Attorney, Agent, or Firm*—Blakely, Sokoloff, Taylor & Zafman LLP

(57) ABSTRACT

Briefly, in accordance with an embodiment of the invention, a method and circuit to perform an analog-to-digital conversion is provided. The method may include generating and storing a combined charge which is generated by combining an input charge and a reference charge.

26 Claims, 4 Drawing Sheets

METHOD AND APPARATUS TO PERFORM AN ANALOG TO DIGITAL CONVERSION

BACKGROUND

Today, many electronic devices, such as computers and cell phones, use analog-to-digital converters (ADCs) to convert analog signals to digital signals. Many analog-to-digital conversion techniques use precise ratio-matching of passive or active components in order to achieve high accuracy. However, semiconductor processing technology may limit the ability to achieve precise matching of components.

Although the use of large components (e.g., large capacitors) may yield precisely matched components, this may not be desirable since it may increase the die area needed for placement of the components. Several conventional ADCs do not use precision ratio-matched components to achieve high accuracy. However, in order to attain ratio-independent operation, these ADCs may use a large number of clock cycles to complete a conversion, thereby increasing the conversion time of the converter.

Thus, there is a continuing need for better ways to perform an analog-to-digital conversion that use less die area and have faster conversion times.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
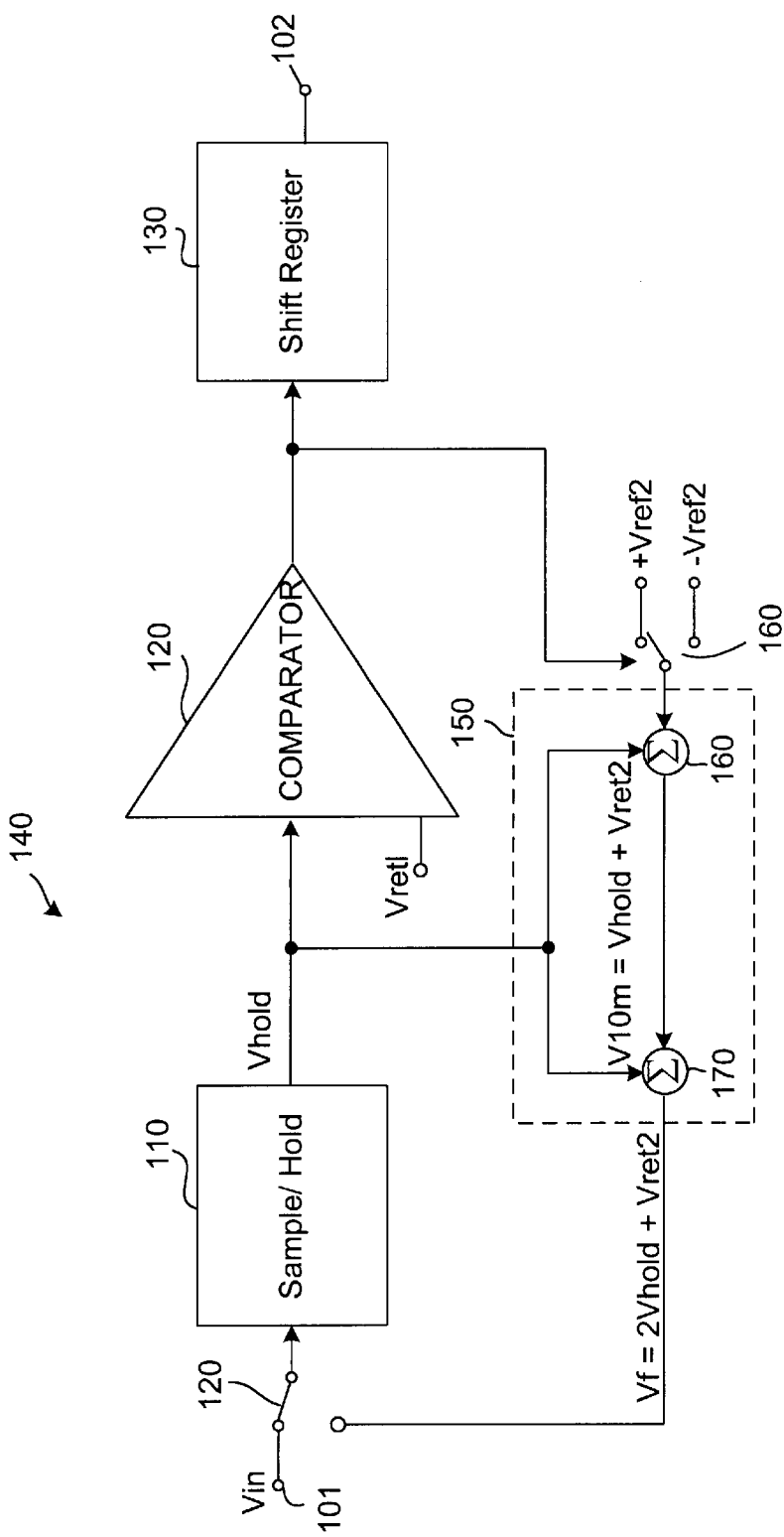
FIG. 1 is a schematic diagram of an analog-to-digital converter (ADC) in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment 100 in accordance with the present invention is described. Embodiment 100 may comprise an analog-to-digital converter (ADC) 140. In this embodiment, ADC 140 may be an algorithmic ADC, also referred to as a cyclic or recirculating ADC. Generally, ADC 140 receives an analog signal at an input terminal 101 and generates a corresponding binary digital signal at an output terminal 102. As an example, ADC 140 may receive an analog signal having a range between 0 and 1.6 volts at input terminal 101, and may generate a 10-bit digital code at output terminal 102.

ADC 140 may comprise a sample/hold circuit 110 adapted to sample an analog signal such as, for example, an input signal labeled $V_{in}$ or a feedback signal labeled $V_f$. ADC 140 includes a switch 120 for selecting either signal $V_{in}$ or signal $V_f$. The sampled voltage is held or maintained (labeled $V_{hold}$) at the output terminal of sample/hold circuit 110 during processing of one bit of data. Sample/hold circuit 110 may comprise an operational amplifier (not shown) for performing the sample and hold operation.

A comparator 120 may be adapted to compare signal $V_{hold}$ to a reference signal (labeled $V_{ref1}$). Comparator 102 generates a resultant signal at its output terminal based on the comparison of the voltage signals at its input terminals. If $V_{hold}$ is greater than $V_{ref1}$, comparator 120 may generate a logic high voltage at its output terminal. Conversely, if $V_{hold}$ is less than $V_{ref1}$, comparator 120 may generate a logic low voltage at its output terminal. A logic low voltage is also referred to as a logic zero and a logic high voltage is also referred to as a logic one. The logic low and high voltages may have voltage potentials of zero and five volts, respectively, although the scope of the present invention is not limited in this respect. In an alternate embodiment, a logic one may have a voltage potential of three volts.

A shift register 130 may be adapted to receive the resultant signal from comparator 120. The resultant signal from comparator 120 represents one bit of digital data. This bit of data may be stored in shift register 130 until processing of the sampled input signal (e.g., $V_{in}$) is complete. The digital signal stored in shift register 102 may be shifted out serially after the analog-to-digital conversion of the sampled input signal is complete.

A feedback circuit 150 may be adapted to receive signal $V_{hold}$ and a reference signal labeled $V_{ref2}$, and in response may generate feedback signal $V_f$. During the processing of a bit of data, the held voltage (i.e. $V_{hold}$) may be modified while maintaining reference voltage $V_{ref1}$, although the scope of the present invention is not limited in this respect. Feedback circuit 150 may provide an algorithm for modifying $V_{hold}$.

In this embodiment, feedback circuit 150 includes a summing device 160 to combine $V_{hold}$ with either $+V_{ref2}$ or $-V_{ref2}$. ADC 140 includes a switch 160 for selecting either $+V_{ref2}$ or $-V_{ref2}$. If the resultant signal from comparator 120 is a logic one, then feedback circuit 150 may sum $V_{hold}$ and $+V_{ref2}$. On the other hand, if the resultant signal from comparator 120 is a logic zero, then feedback circuit 150 may sum $V_{hold}$ and $-V_{ref2}$. In other words, summing device 160 may generate a combined signal or sum signal of $V_{hold} \pm V_{ref2}$. After the first summation by summing device 160, feedback circuit 150 may perform a second summation using a summing device 170. Summing device 170 combines $V_{hold}$ and the sum signal from summing device 160 to generate a resultant signal of $2*_{Vhold} \pm V_{ref2}$. The resultant signal from summing device 170 may be signal $V_f$, which may be transmitted to switch 120 for further processing by ADC 140. Feedback circuit 150 (FIG. 1) may be implemented using switched-capacitor techniques, although the scope of the present invention is not limited in this respect.

It should be noted that the feedback signal $V_f$ may be generated by performing a double summation. That is, feedback signal $V_f$ may be generated by performing two summing operations using summing devices 160 and 170.

The above described process of comparing signal $V_{hold}$ to signal $V_{ref1}$, and generating signal $V_f$ may be repeated until the desired number of bits have been obtained in shift register 130. For example, in order to attain ten-bit resolution, the above described operation of ADC 140 may be repeated ten times.

Figure 2:
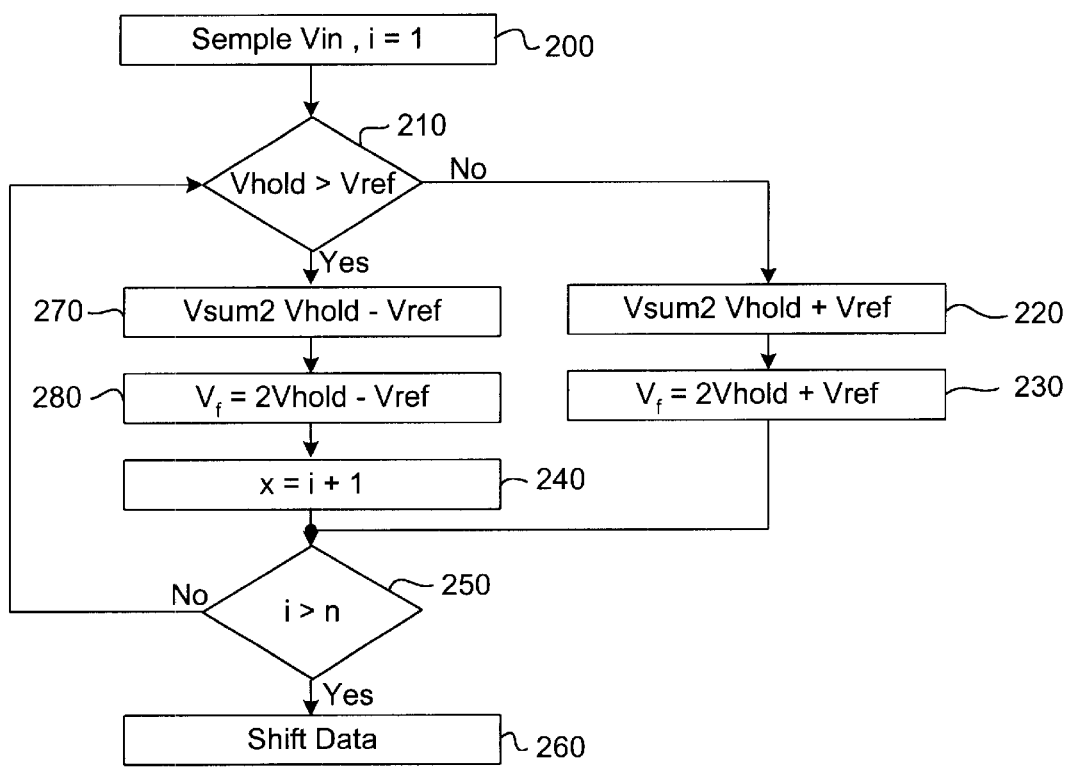
FIG. 2 is a flow chart of a method of converting an analog signal to a digital signal in accordance with an embodiment of the present invention.

Turning now to FIG. 2, a method of converting an analog signal to a digital signal in accordance with an embodiment of the present invention is provided. This method may be implemented using ADC 140 of FIG. 1. In the flow chart shown in FIG. 2, "i" may represent the number of iterations and N may represent the total number of bits. This embodiment may begin with sampling the analog signal $V_{in}$, block 200. By way of example, $V_{in}$ may be a voltage signal having a voltage potential of 1.0 volts. $V_{ref1}$ and $V_{ref2}$ may have voltage potentials of 0.8 and 1.6 volts, respectively.

Sample/hold circuit 110 may generate signal $V_{hold}$ in response to sampling signal $V_{in}$. Accordingly, $V_{hold}$ may be 1.0 volts during processing of the first bit. Comparator 120 compares $V_{hold}$ to $V_{ref1}$ (block 210), and in this example, generates a logic one in response to the comparison. Thus, the first bit of the digital code (e.g., the most significant bit) may be a logic one, which is stored in shift register 130.

Since the resultant signal from comparator 120 is a logic one, feedback circuit 150 combines $V_{hold}$ and $+V_{ref2}$ (block 220) to generate $V_{sum}$ having a value of about 2.6 volts. Summing circuit 170 may then combine $V_{sum}$ and $V_{hold}$ (block 230) to generate $V_f$ having a value of about 3.6 volts. The iteration count is increased (block 240), and then the process is repeated (block 250) and $V_{hold}$ becomes $V_f$ in subsequent iterations. When the predetermined number of bits have been obtained (block 250), the digital code stored in shift register 130 may be transmitted from terminal 102 (block 260) for processing by, for example, a processor (e.g., processor 720 illustrated in FIG. 7), although the scope of the present invention is not limited in this respect. In another example, if $V_{hold}$ is less than $V_{ref1}$, then the acts in blocks 270 and 280 may be performed.

Turning to FIGS. 3–6, an embodiment 300 in accordance with the present invention is described. FIGS. 3–6 illustrate a switching sequence of a feedback circuit 350 in accordance with an embodiment of the present invention. It should be noted that feedback circuit 150 of ADC 140 (FIG. 1) may be implemented using the switched-capacitor circuit illustrated in FIGS. 3–6. For simplicity, feedback circuit 350 is described using single-ended circuitry, although the scope of the present invention is not limited in this respect. In an alternate embodiment, feedback circuit 350 may be implemented using differential circuitry.

Feedback circuit 350 comprises an operational amplifier 310, capacitors 320 and 330, and switches 341, 342, 343, 344, 345, and 346. Four clock cycles are illustrated in FIGS. 3–6. The position of switches 341–346 may be changed during the clock cycle. For example, during the first clock cycle (illustrated in FIG. 3), switches 342 and 345 are open and switches 343, 344, and 346 are closed. During the second clock cycle (illustrated in FIG. 4), switch 345 is closed and switches 343 and 346 are opened, while the positions of switches 342 and 344 remain unchanged. Feedback circuit 350 includes a switch 341 for selecting either $V_{hold}$, $+V_{ref2}$, or $-V_{ref2}$.

For simplicity, the operation of feedback circuit 350 is illustrated by describing charges transferred between capacitors 320 and 330 during the four clock cycles, rather than describing the voltage of capacitors 320 and 330. Referring back to FIG. 3, switch 341 is closed during the first clock cycle so that an input voltage signal such as, for example, $V_{hold}$ is sampled by capacitor 320. In other words, an input charge (labeled $Q_{hold}$) representing the voltage potential of $V_{hold}$ is stored in capacitor 320.

During the second clock cycle (FIG. 4), the position of switch 341 is changed so that $+V_{ref2}$ is transmitted to capacitor 320. Switches 342, 343, and 346 are open and switches 344 and 345 are closed. Accordingly, during the second clock cycle, signal $+V_{ref2}$ is sampled, and a reference charge (labeled $+Q_{ref2}$) representing $+V_{ref2}$ is generated. Further, during the second clock cycle, a combination charge (labeled $Q_{hold}+Q_{ref2}$) is stored in capacitor 330. The combination charge is generated by combining charges $Q_{hold}$ and $+Q_{ref2}$.

Figure 3:
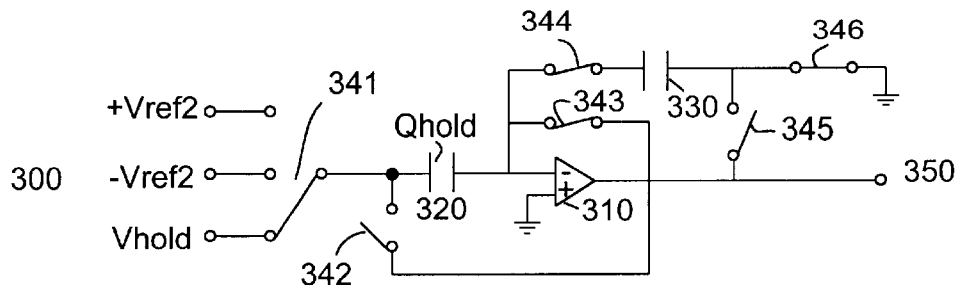
FIG. 3 illustrates one clock cycle of a switching sequence of a feedback circuit in accordance with an embodiment of the present invention.

During the third clock cycle (FIG. 5), switches 341, 343, and 345 are closed and switches 342, 344, and 346 are open. This results in voltage $V_{hold}$ being sampled again by capacitor 320, and another corresponding input charge of $Q_{hold}$ is stored in capacitor 320 during the third clock cycle. In this embodiment, the input charge of $Q_{hold}$ stored in capacitor 320 during the third clock cycle is approximately equal to the input charge of $Q_{hold}$ stored in capacitor 320 during the first clock cycle (FIG. 3). In other words, the magnitude of the charge $Q_{hold}$ stored in capacitor 320 during the third clock cycle is approximately equal to the magnitude of the charge $Q_{hold}$ stored in capacitor 320. during the first clock cycle (illustrated in FIG. 3) since these charges are generated by sampling the same input voltage (e.g., voltage $V_{hold}$). During the third clock cycle, the combination charge of $Q_{hold}+Q_{ref2}$ may be maintained in capacitor 330.

Figure 4:
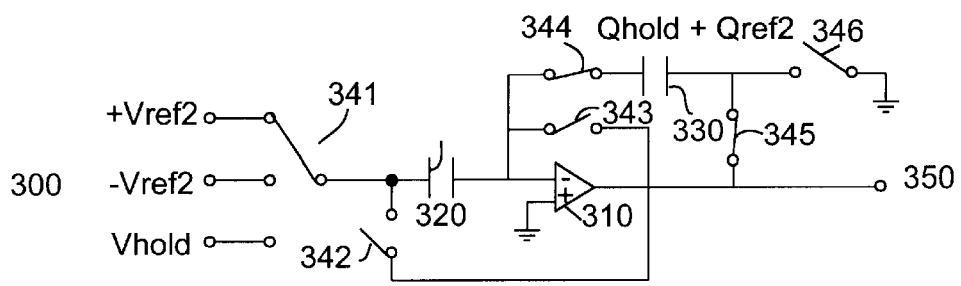
FIG. 4 illustrates a second clock cycle of a switching sequence of a feedback circuit in accordance with an embodiment of the present invention.
Figure 5:
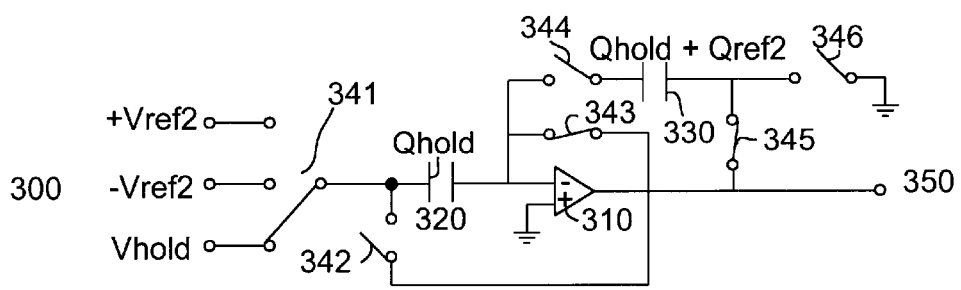
FIG. 5 illustrates a third clock cycle of a switching sequence of a feedback circuit in accordance with an embodiment of the present invention.
Figure 6:
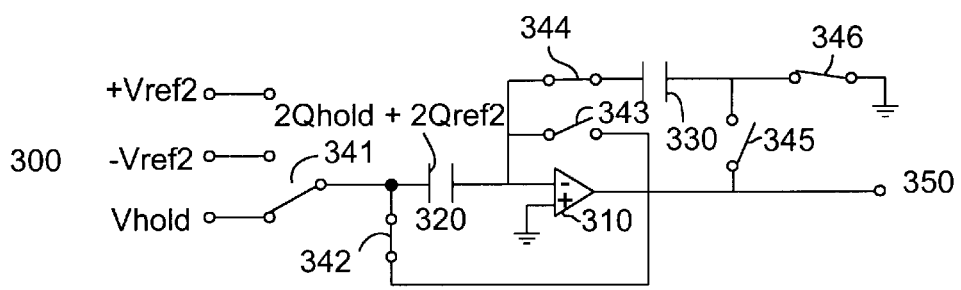
FIG. 6 illustrates a fourth clock cycle of a switching sequence of a feedback circuit in accordance with an embodiment of the present invention.

During the fourth clock cycle (FIG. 6), switches 342, 344, and 346 are closed and switches 341, 343, and 345 are open. This results in the combination charge of $Q_{hold}+Q_{ref2}$ being transferred from capacitor 330 to capacitor 320. Thus, the combination charge of $Q_{hold}+Q_{ref2}$ is combined with charge $Q_{hold}$, thereby resulting in a resultant combination charge or feedback charge of $2*Q_{hold}+Q_{ref2}$ which is stored in capacitor 320. Accordingly, a feedback voltage of $2*V_{hold}+V_{ref2}$ is provided at the output terminal of amplifier 310. Thus, the feedback voltage is substantially equal to the sum of reference voltage $V_{ref2}$ and double the input voltage $V_{hold}$. As illustrated in FIGS. 3–6, feedback voltage signal $V_f$ may be generated during four clock cycles by performing two combination operations, e.g., two summation operations. In embodiment 300, the first combination of charges ($Q_{hold}+Q_{ref2}$) occurs during the second clock cycle (FIG. 2) and the second combination of charges ($Q_{hold}+(Q_{hold}+Q_{ref2})$) occurs during the fourth clock cycle (FIG. 4).

Although not shown in FIGS. 3–6, it should be understood that a feedback charge of $2*Q_{hold}-Q_{ref2}$ may be generated and stored in capacitor 320. This may be accomplished by positioning switch 341 so that $-V_{ref2}$ is transmitted to capacitor 320 during the second clock cycle (FIG. 2). Such an action would result in a combination charge of $Q_{hold}-Q_{ref2}$ being stored in capacitor 330 during the second clock cycle, where the combination charge represents the difference of the input charge $Q_{hold}$ and the reference charge $Q_{ref2}$.

As illustrated in FIGS. 3–6, feedback circuit 350 may complete an n-bit conversion in 4n clock cycles. In addition, feedback circuit 350 performs a cyclic analog-to-digital conversion in a capacitor ratio-independent manner, i.e., without the use of precise ratio-matched capacitors.

Figure 7:
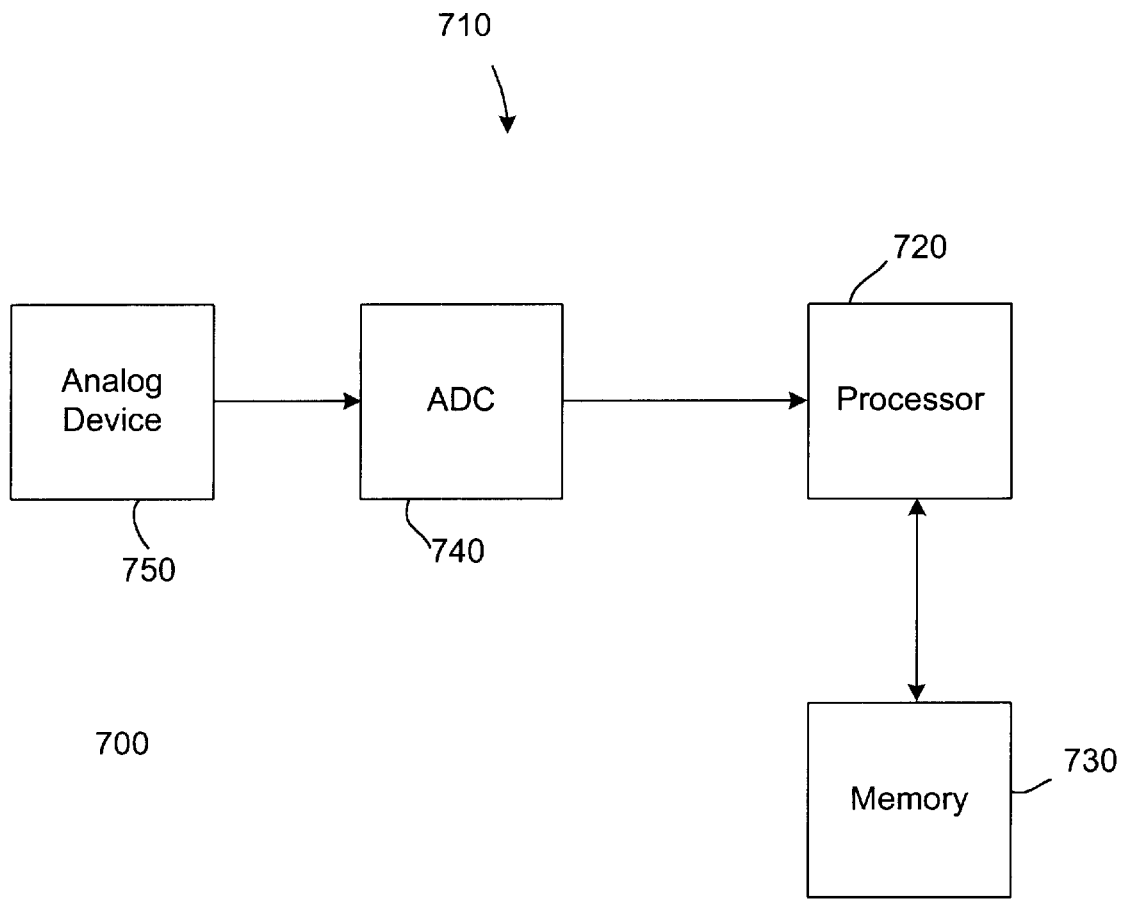
FIG. 7 is a block diagram of an electronic system in accordance with an embodiment of the present invention.

Turning to FIG. 7, an embodiment 700 in accordance with the present invention is described. Embodiment 700 may comprise an electronic system 710. Electronic system 710 may be used in a variety of portable communication systems such as, for example, a mobile communication device (e.g., cell phone), a two-way radio communication system, a one-way pager, a two-way pager, a personal communication system (PCS), a portable computer, a personal digital assistant (PDA), or the like. Although it should be pointed out that the scope and application of the present invention is in no way limited to these examples. For example, other applications where the present invention may be used are non-portable electronic applications, such as in cellular base stations, servers, desktop computers, video equipment, etc.

In this example, electronic system 710 may include a processor 720, a memory 730 connected to processor 720, an ADC 740 connected to processor 720, and an analog device 750 connected to ADC 740. Processor 720 may comprise, for example, a microprocessor, a digital signal processor, a microcontroller, or the like.

Instructions to be executed by processor 720 may be stored in memory 730, although the scope of the present invention is not limited in this respect. Memory 730 may be volatile or non-volatile memory, although the scope of the present invention is not limited in this respect.

Analog device 750 may be a device capable of generating an analog signal representing variables such as, for example, voltage, current, pressure, temperature, velocity, etc. In alternate embodiments, analog device 750 may be a temperature or pressure sensor, although the scope of the present invention is not limited in this respect.

The operation and structure of ADC 740 may be similar to the operation and structure of ADC 140 described above with reference to FIG. 1. Generally, ADC 740 may be adapted to receive an analog signal from analog device 750. In response to the analog signal, ADC 740 may provide a digital signal suitable for processing by processor 720.

By way of example, analog device 750 may be a touch-screen. A user may draw an alphanumeric character on the touch-screen. The pictorial representation of the alphanumeric character on the touch-screen may be converted to a corresponding analog voltage by analog device 750. ADC 740 may convert the analog voltage to a digital value, e.g., a 10-bit digital signal. The digital signal may be transmitted to processor 720 for processing.

It should be understood that electronic system 710 may also include other components not shown in FIG. 7, such as a display, a bus, etc., although the scope of the present invention is not limited by the inclusion or exclusion of such components.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method of converting an analog signal to a digital signal, comprising:

storing a first combination charge generated by combining an input charge and a reference charge; and storing a second combination charge generated by combining the input charge and the first combination charge.

2. The method of claim 1, wherein the input charge is generated during a first clock cycle, storing the first combination charge occurs during a second clock cycle, another instance of the input charge is generated during a third clock cycle, and storing the second combination charge occurs during a fourth clock cycle.

3. The method of claim 1, wherein combining the input charge and the reference charge includes summing the input charge and the reference charge.

4. The method of claim 1, wherein combining the input charge and the reference charge includes subtracting the input charge and the reference charge.

5. The method of claim 1, further comprising:

sampling an input voltage to generate the input charge; and sampling a reference voltage to generate the reference charge.

6. The method of claim 5, further comprising:

sampling the input voltage to generate another instance of the input charge; and generating a feedback voltage from the second combination charge.

7. The method of claim 6, wherein storing the first combination charge includes storing the first combination charge in a first capacitor and storing the second combination charge includes storing the second combination charge in a second capacitor.

8. The method of claim 6, wherein the feedback voltage is generated in four clock cycles.

9. The method of claim 6, wherein the feedback voltage represents a voltage substantially equal to the sum of the reference voltage and double the input voltage.

10. The method of claim 6, further comprising comparing the feedback voltage to a second reference voltage to generate a bit of the digital signal.

11. The method of claim 5, further comprising comparing the input voltage to a second reference voltage to generate a bit of the digital signal.

12. The method of claim 11, wherein the first combination charge represents the sum of the input and reference voltages when the bit of the digital signal is a logic one.

13. The method of claim 11, wherein the first combination charge represents the difference of the input and reference voltages when the bit of the digital signal is a logic zero.

14. A method of converting an analog signal to a digital signal, comprising:

combining an input voltage and a reference voltage to generate a combined voltage; and combining the input voltage and the combined voltage to generate a feedback voltage.

15. The method of claim 14, further comprising storing the combined voltage in a first capacitor.

16. The method of claim 15, further comprising storing the feedback voltage in a second capacitor.

17. The method of claim 15, further comprising comparing the input voltage to a second reference voltage to generate a bit of the digital signal.

18. A circuit, comprising:
   a comparator having a first terminal adapted to receive an input signal, a second terminal adapted to receive a first reference signal, and a third terminal adapted to provide an output signal;
   a first summing device having a first terminal adapted to receive the input signal, a second terminal adapted to receive a second reference signal, and a third terminal adapted to provide a first sum signal; and
   a second summing device having a first terminal adapted to receive the input signal, a second terminal adapted to receive the first sum signal, and a third terminal adapted to provide a second sum signal.

19. The circuit of claim 18, further comprising a sample/hold circuit having a first terminal adapted to receive the second sum signal and a second terminal adapted to provide the input signal.

20. The circuit of claim 19, further comprising a register having a terminal coupled to the third terminal of the comparator.

21. An apparatus, comprising:
   an analog device adapted to provide an analog signal;
   an analog-to-digital converter (ADC) having a first terminal adapted to received the analog signal and a second terminal adapted to provide a digital signal; and
   a processor having a terminal coupled to the second terminal of the ADC, wherein the ADC comprises:
      a feedback circuit having a first terminal adapted to receive the analog signal, wherein the feedback circuit is adapted to provide a feedback signal by combining the analog signal and a reference signal to generate a combined signal and combining the combined signal with the analog signal to generate the feedback signal.

22. The apparatus of claim of claim 21, wherein the ADC further comprises a comparator having a first terminal adapted to receive the analog signal, a second terminal adapted to receive a second reference signal, and a third terminal adapted to provide the digital signal.

23. The apparatus of claim 21, wherein the feedback circuit comprises:
   an amplifier having a first terminal adapted to receive an operating voltage potential;
   a first capacitor adapted to store a charge representing the feedback signal and having a first terminal coupled to a second terminal of the amplifier; and
   a second capacitor adapted to store a charge representing the sum of the analog signal and the reference signal, wherein the second capacitor has a first terminal coupled to the second terminal of the amplifier and a second terminal coupled to a third terminal of the amplifier.

24. The apparatus of claim 23, wherein the feedback circuit further comprises:
   a first switch coupled between a second terminal of the first capacitor and the third terminal of the amplifier;
   a second switch coupled between the second terminal of the amplifier and the third terminal of the amplifier;
   a third switch, wherein the first terminal of the second capacitor is coupled to the second terminal of the amplifier via the third switch; and
   a fourth switch, wherein the second terminal of the second capacitor is coupled to the third terminal of the amplifier via the fourth switch.

25. The apparatus of claim 21, wherein combining the analog signal and a reference signal includes summing a charge representing the analog signal with a charge representing the reference signal.

26. The apparatus of claim 21, wherein the feedback circuit further comprises:
   a first summing device adapted to generate the combined signal; and
   a second summing device adapted to generate the feedback signal.

* * * * *